(12) United States Patent
Aoki

(10) Patent No.: US 6,907,594 B2
(45) Date of Patent: Jun. 14, 2005

(54) WIRING ROUTE DETERMINING APPARATUS, GROUP DETERMINING APPARATUS, WIRING ROUTE DETERMINING PROGRAM STORING MEDIUM AND GROUP DETERMINING PROGRAM STORING MEDIUM

(75) Inventor: Katsushi Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/101,833

(22) Filed: Mar. 21, 2002

(65) Prior Publication Data

US 2003/0106036 A1 Jun. 5, 2003

(30) Foreign Application Priority Data

Dec. 3, 2001 (JP) ......................................... 2001-369055

(51) Int. Cl.[7] .............................................. G06F 17/50
(52) U.S. Cl. ............................. 716/13; 716/14; 716/10; 716/7
(58) Field of Search ................................ 716/7, 13, 14, 716/10

(56) References Cited

U.S. PATENT DOCUMENTS

| | | | | |
|---|---|---|---|---|
| 4,630,219 A | * | 12/1986 | DiGiacomo et al. | 716/9 |
| 5,663,891 A | * | 9/1997 | Bamji et al. | 716/2 |
| 5,808,899 A | * | 9/1998 | Scepanovic et al. | 716/2 |
| 5,835,381 A | * | 11/1998 | Scepanovic et al. | 716/10 |
| 5,914,888 A | * | 6/1999 | Scepanovic et al. | 716/8 |
| 5,984,510 A | * | 11/1999 | Guruswamy et al. | 716/2 |
| 5,987,086 A | * | 11/1999 | Raman et al. | 716/1 |
| 6,122,443 A | * | 9/2000 | Nishikawa | 716/8 |
| 6,154,873 A | * | 11/2000 | Takahashi | 716/10 |
| 6,175,950 B1 | * | 1/2001 | Scepanovic et al. | 716/13 |
| 6,292,928 B1 | * | 9/2001 | Yamaguchi et al. | 716/13 |
| 6,618,849 B2 | * | 9/2003 | Teig et al. | 716/12 |
| 6,662,348 B1 | * | 12/2003 | Naylor et al. | 716/9 |
| 6,665,852 B2 | * | 12/2003 | Xing et al. | 716/12 |
| 6,745,379 B2 | * | 6/2004 | Teig et al. | 716/14 |
| 6,829,757 B1 | * | 12/2004 | Teig et al. | 716/12 |
| 2001/0003843 A1 | * | 6/2001 | Scepanovic et al. | 716/7 |
| 2001/0009031 A1 | * | 7/2001 | Nitta et al. | 716/13 |
| 2001/0018759 A1 | * | 8/2001 | Andreev et al. | 716/7 |
| 2002/0104061 A1 | * | 8/2002 | Xing et al. | 716/4 |

FOREIGN PATENT DOCUMENTS

| | | | | |
|---|---|---|---|---|
| JP | 01-302850 | 12/1989 | | H01L/27/04 |
| JP | 11-126217 | 5/1999 | | G06F/17/50 |

OTHER PUBLICATIONS

Vutukurv et al., "MDVA: a distance–vector multipath routing protocol", Proceedings of IEEE Twentieth Annual Joint Conferenc of the IEEE Computer and Communications Societies, vol. 1, Apr. 22, 2001, pp. 557–564.*

Chang et al., "Force directed self–organizing map and its application to VLSI cell placement", IEEE International Conference on Neural Networks, vol. 1, Mar. 28, 1993, pp. 103–109.*

(Continued)

*Primary Examiner*—Matthew Smith
*Assistant Examiner*—Phallaka Kik
(74) *Attorney, Agent, or Firm*—Staas & Halsey LLP

(57) ABSTRACT

A wiring route determining apparatus or the like for determining a wiring route for wiring plural blocks dispersedly arranged on a plane in series while taking into account a distance between the blocks and determines a wiring route capable of efficiently wiring blocks such as flip-flops. The wiring route determining apparatus or the like independently weights the distance between the blocks vertically and horizontally and determines a wiring route taking into account the distance which is weighted.

14 Claims, 20 Drawing Sheets

OTHER PUBLICATIONS

Basaran et al., "Latchup–aware placement and parasitic–bounded routing of custom analog cells", 1993 IEEE/ACM Internationa Conference on Computer–Aided Design, Nov. 7, 1993, pp. 415–421.*

Sellen, "Direction weighted shorted path planning", Proceedings of 1995 IEEE International Conference on Robotics and Automation, vol. 2, May 21, 1995, pp. 1970–1975.*

NN9207408, "Method of Partitioning Data Path Macros Stacks in Data Path VLSI Chips", IBM Technical Disclosure Bulletin, Vo 35, No. 2, Jul. 1992, pp. 408–413 (9 pages).*

NN83102625, "Estimating Chip Wirability by Routing Averaging", IBM Technical Disclosure Bulletin, vol. 26, No. 5, Oct. 1983, pp. 2625–2633 (12 pages).*

Hirsch et al., "The effect of placement of automatically extracted structure", IEEE Transactions on Computer–Aided Design of Integrated Circuits and Systems, vol. 11, No. 9, pp. 1140–1152.*

Cheung et al., "A new optimization cost model for VLSI standard cell placement", Proceedings of 1997 IEEE International Symposium on Circuits and Systems, vol. 3, Jun. 9, 1997, pp. 1708–1711.*

Szymanski et al., "Spanning tree algorithm for spare network capacity", Canadian Conference on Electrical and Computer Engineering, vol. 1, May 13, 2001, pp. 447–452.*

Bauer et al., "Efficient frontier formulation for additive and restrictive metrics in hierarchical routing", vol. 3, Jun. 18, 2000, pp. 1353–1359.*

Yazdani et al., "A gridless multilayer channel router", Proceedings of Fourteenth Annual International Computer Software and Applications Conference, Oct. 31, 1990, pp. 363–368.*

Gyurcsik et al., "A generalized approach to routing mixing analog and digital signals nets in a channel", IEEE Journal of Solid–State Circuits, vol. 24, No. 2, Apr. 1989, pp. 436–442.*

* cited by examiner

WIRING ROUTE DETERMINING APPARATUS, GROUP DETERMINING APPARATUS, WIRING ROUTE DETERMINING PROGRAM STORING MEDIUM AND GROUP DETERMINING PROGRAM STORING MEDIUM

BACKGROUND OF THE INVENTION

1. Field of the Invention

The present invention relates to a wiring route determining apparatus for determining a wiring route in consideration of distance between blocks on which plural blocks dispersedly arranged on a plane are wired in series and a group determining apparatus for determining groups of blocks by classifying plural blocks dispersedly arranged on a plane in consideration of distance between blocks, and a wiring route determining program storing medium having stored therein a wiring route determining program for causing a computer to operate as a wiring route determining apparatus and a group determining program storing medium storing therein a group determining program for causing a computer to operate as a group determining apparatus.

2. Description of the Related Art

Conventionally, in the field of LSI, a so-called scan test is widely implemented. With the scan test, a wiring (scan path) for connecting a multiplicity of flip-flops to be configured in an LSI in series is constituted in advance in designing a circuit and, after the LSI is manufactured, test data is received and data inside the LSI is sent out by using the scan path incorporated in the LSI, whereby the LSI is tested to find whether or not it operates normally.

As the LSI is becoming larger in size and more highly integrated in recent years, a wiring amount of a scan path tends to affect a layout acceptability of an LSI more significantly.

In the LSI, a lot of wirings other than scan paths are laid in all directions. It is a significant subject to find out a way to form a scan path with high wiring efficiency in such a configuration.

In addition, a clock wiring for supplying a clock is required for a flip-flop to be connected by the scan path. In this case, a multiplicity of flip-flops are classified into groups and outputs of identical buffers are wired for each group. In this case, wiring efficiency of a clock wiring varies greatly depending on how a group of flip-flops is formed.

SUMMARY OF THE INVENTION

The present invention has been achieved in view of these problems, and it is an object of the present invention to provide a wiring route determining apparatus for determining a wiring route capable of wiring blocks such as flip-flops or the like in series efficiently and a group determining apparatus capable of classifying blocks such as flip-flops or the like into groups capable of wiring them in parallel efficiently as well as a wiring route determining program storing medium having stored therein a wiring route determining program for causing a computer to operate as such a wiring route determining apparatus and a group determining program storing medium having stored therein a group determining program for causing a computer to operate as a group determining apparatus.

In order to attain the above-described object, a wiring route determining apparatus of the present invention is a wiring route determining apparatus for determining a wiring route in consideration of distance between blocks for wiring plural blocks dispersedly arranged on a plane in series, comprising:

a weighting portion weighting a distance between blocks in each of a predetermined first direction and a second direction different from the first direction independently; and a wiring route determining portion determining the wiring route based on the distance which is weighted by the weighting portion.

The wiring route determining apparatus of the present invention is for weighting to a distance between blocks in each of a first direction and a second direction independently to determine a wiring route based on the distance which is weighted. The wiring route determining apparatus is capable of determining a wiring route having good wiring efficiency by weighting according to a degree of congestion of various wirings in the first and second directions before determining the wiring route.

Here, the above-described wiring route determining apparatus of the present invention preferably comprises an area dividing portion for dividing the plane on which the plural blocks are dispersedly arranged into plural areas, wherein the above-described weighting portion weights a distance between blocks independently for each of the plural areas divided by the area dividing portion and independently in the first and second directions.

Consequently, the distance between the blocks for each area is weighted according to a degree of congestion of wirings in the first and second direction of each area, whereby improvement of wiring efficiency can be realized.

Here, in the above-described wiring route determining apparatus of the present invention, the weighting portion may weight a distance between blocks in each of the first and second directions independently according to an operation of an operator, or the above-described plane on which plural blocks are dispersedly arranged may have wirings extending in the first direction and wirings extending in the second direction and the weighting portion may weight a distance between blocks in each of the first and second directions independently based on a degree of congestion of wirings in each of the first and second directions.

In addition, if the wiring route determining apparatus is provided with the above-described area dividing portion, the weighting portion may weight a distance between areas adjacent to each other.

In addition, the group determining apparatus of the present invention attaining the above-described object is a group determining apparatus for determining groups of blocks by classifying plural blocks dispersedly arranged on a plane into plural groups, comprising:

a weighting portion weighting a distance between blocks in each of a predetermined first direction and a second direction different from the first direction independently; and a group determining unit determining the groups based on the distance which is weighted by the weighting portion.

The group determining apparatus of the present invention is for weighting a distance between blocks in each of a first direction and a second direction independently to determine a group based on the distance which is weighted in the same manner as the wiring route determining apparatus of the present invention does. The group determining apparatus is capable of classifying blocks with good wiring efficiency by weighting according to a degree of congestion of wirings in the first and second directions.

In addition, the wiring route determining program storing medium of the present invention attaining the above-described object is a wiring route determining program storing medium having stored therein a wiring route determining program that is executed in a computer and causes the computer to operate as a wiring route determining apparatus for determining a wiring route for wiring plural blocks dispersedly arranged on a plane in series, comprising:

a weighting portion weighting a distance between blocks in each of a predetermined first direction and a second direction different from the first direction independently; and a wiring route determining portion determining the wiring route based on the distance which is weighted by the weighting portion.

Moreover, the group determining program storing medium of the present invention attaining the above-described object is a group determining program storing medium having stored therein a group determining program that is executed in a computer and causes the computer to operate as a group determining apparatus for determining groups of blocks by dividing plural blocks dispersedly arranged on a plane into plural groups, comprising:

a weighting portion for weighting a distance between blocks in each of a predetermined first direction and a second direction different from the first direction independently; and a group determining unit determining the groups based on the distance which is weighted by the weighting portion.

Further, in the present invention, "first direction" and "second direction" may be, for example, "vertical direction" and "horizontal direction" but is not limited to these, and may be any directions such as oblique directions or the like different from each other as long as the directions are different from each other.

BRIEF DESCRIPTION OF THE DRAWINGS

FIG. 13 illustrates the state in which FIG. 12 is reduced in the horizontal direction by the amount of weight and the LSI is returned to the size identical with those in FIGS. 9 and 10;

FIG. 16 illustrates the state in which FIG. 15 is reduced in the vertical direction by the amount of weight and the LSI is returned to the original size;

DETAILED DESCRIPTION OF THE PREFERRED EMBODIMENTS

Embodiments of the present invention will be hereinafter described.

Here, in order to facilitate understanding, an outline of processing carried out by the present invention will be shown as an example first.

Figure 1:
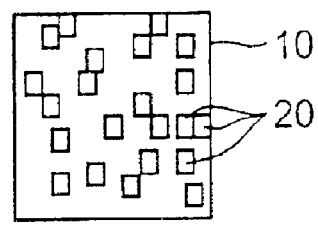
FIG. 1 illustrates plural blocks dispersedly arranged on an LSI.

FIG. 1 illustrates plural blocks (flip-flops in this context) dispersedly arranged on an LSI.

An LSI 10 shown here is not an actual LSI but an LSI configured on data in an arrangement and wiring tool. A multiplicity of blocks 20 that are also dispersedly arranged on the data are shown on this LSI. No wiring is shown here but a lot of wirings other than wiring for connecting these blocks 20 in series (wiring for a scan path in this context) which are going to be carried out now, extend vertically and horizontally on this LSI 10. These vertical and horizontal wirings are also saved as data.

An arrangement and wiring on data are treated in the following descriptions and, therefore, all the descriptions are related to treatment of an arrangement and wiring on data unless specifically noted.

Here, a wiring route (wiring route of wiring for a scan path in this context) for wiring in series plural blocks (flip-flops in this context) dispersedly arranged on the LSI 10 shown in FIG. 1 is determined.

At this point, a lot of wirings extending vertically and horizontally is already formed on this LSI 10. First, a degree of congestion in the vertical direction and a degree of congestion in the horizontal direction of the wirings are evaluated. Then, taking into account those degrees of congestion, weight of 1.0 is added (i.e., no particular weight is added) to a distance between blocks in a direction with a low degree of congestion and weight larger than 1.0 is added to a distance between blocks in a direction with a higher degree of congestion. Next, those plural blocks are wired in series taking into account the distance which is weighted.

Here, in weighting a distance, an operator may take into account the degrees of congestion in the vertical and horizontal directions of the wirings to operate and input weight as a result of the consideration. Alternatively, this apparatus itself may take into account the degrees of congestion in the vertical and horizontal directions of the wirings to automatically give weight.

Wiring after weight is given is carried out in the apparatus using, for example, a wiring tool to which a resolution of a traveling salesman problem which conventionally exists is applied.

Figure 2:
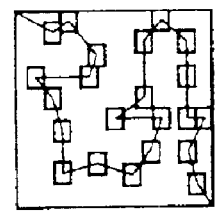
FIG. 2 illustrates a result of wiring a multiplicity of blocks dispersedly arranged on the LSI of FIG. 1 in series while keeping vertical and horizontal weight identical (without weighting)

FIG. 2 illustrates a result of wiring a multiplicity of blocks dispersedly arranged on the LSI 10 of FIG. 1 in series while keeping vertical and horizontal weight identical (without weighting).

This wiring extends vertically and horizontally at the same degree of length as a whole.

Figure 3:
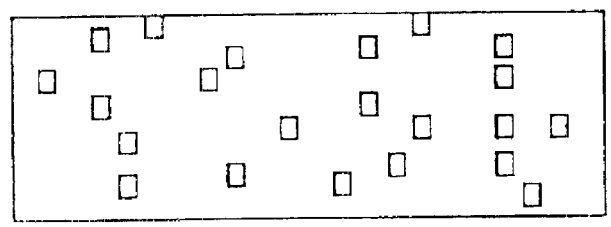
FIG. 3 illustrates the state in which a distance in a horizontal direction is weighted.

FIG. 3 illustrates a state in which a distance in the horizontal direction is weighted taking into consideration of the fact that wirings are congested in the horizontal direction.

Weighting a distance in the horizontal direction is equivalent to extending the LSI 10 shown in FIG. 1 in the horizontal direction by an amount of the weight and expanding an interval between blocks by the amount of the weight as well. FIG. 3 shows a state in which weight of 3.0 is added in the horizontal direction, that is, the LSI 10 is extended to be three times as large in the horizontal direction.

Figure 4:
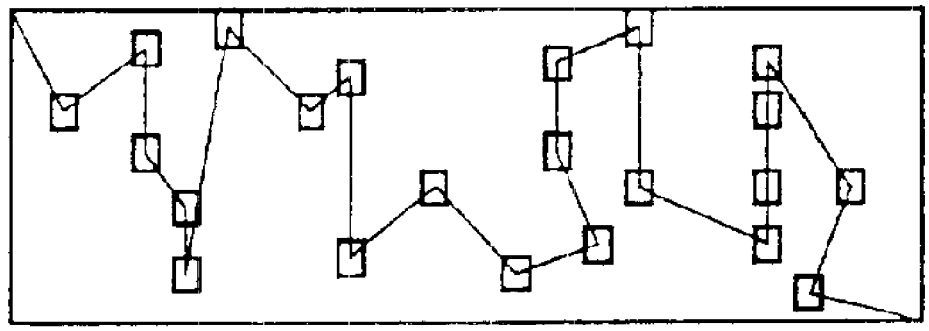
FIG. 4 illustrates a result of wiring dispersedly arranged blocks in the state in which they are weighted in a horizontal direction.

FIG. 4 illustrates a result of wiring blocks dispersedly arranged in a state in which weight is added in the horizontal direction. This wiring extends vertically and horizontally at the same degree of length overall on the figure.

Figure 5:
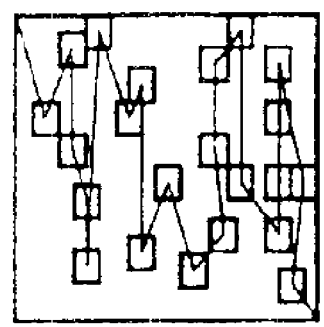
FIG. 5 shows FIG. 4 reduced in the horizontal direction by the amount of weight.

FIG. 5 shows FIG. 4 reduced in the horizontal direction by the amount of weight.

When a wiring is laid with weight (3.0 in this context) added in the horizontal direction, a wiring route extending in the vertical direction as a whole is obtained on an LSI of an actual size.

It is assumed that a lot of wirings already formed except the wiring route for a scan path that is prepared in this context are more congested in the horizontal direction as described above. As a result of adding weight in the horizontal direction to lay a wiring for a scan path in this context, this wiring route becomes a wiring extending in the vertical direction as a whole and wirings as a whole with the wiring for a scan path added in this context have an alleviated vertical and horizontal difference in degrees of congestion of wirings compared with wirings before adding the wiring for a scan path of this context, whereby wiring efficiency is improved.

The case in which wirings are congested in the vertical direction will be described next.

Figure 6:
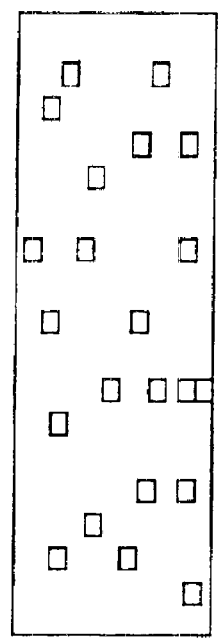
FIG. 6 illustrates the state in which a distance in a vertical direction is weighted.

FIG. 6 illustrates a state in which a distance in the vertical direction is weighted taking into account the fact that wirings in the vertical direction are congested.

Weighting in the vertical direction is equivalent to extending the LSI 10 shown in FIG. 1 in the vertical direction by the amount of the weight and expanding a distance between blocks dispersedly arranged on the LSI in the vertical direction by the amount of the weight as well. FIG. 6 shows the case in which weight of 3.0 is added in the vertical direction.

Figure 7:
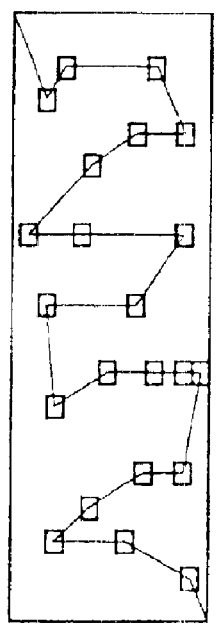
FIG. 7 illustrates a result of wiring blocks dispersedly arranged on an LSI in the state in which they are weighted in the vertical direction.

FIG. 7 shows a result of wiring the blocks dispersedly arranged on the LSI in the state in which weight is added in the vertical direction as shown in FIG. 6.

On FIG. 7, this wiring extends vertically and horizontally at the same degree as a whole.

Figure 8:
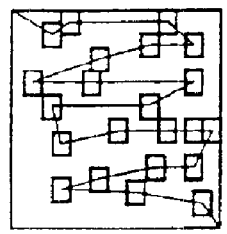
FIG. 8 shows FIG. 7 reduced in the vertical direction by the amount of weight.

FIG. 8 shows FIG. 7 reduced in the vertical direction by the amount of weight.

When weight (3.0 in this context) is added in the vertical direction to lay a wiring, a wiring route extending in the horizontal direction as a whole is obtained on an LSI of an actual size, a vertical and horizontal difference in degrees of congestion of wirings as a whole including the wiring for a scan path of this context is alleviated and a possibility that a large bypass or the like occurs in actually laying the wiring for a scan path of this context is reduced, whereby wiring efficiency is improved.

Next, a method of classifying blocks into groups in the present invention will be described.

Figure 9:
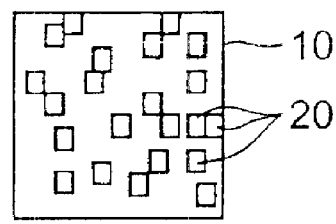
FIG. 9 illustrates an LSI on which plural blocks are dispersedly arranged.

FIG. 9 illustrates the LSI 10 on which the plural blocks 20 are dispersedly arranged as in FIG. 1.

Here, these plural blocks are classified into groups in which each group is a unit of a fewer plural blocks for a clock wiring for supplying a clock to these plural blocks (flip-flops in this context). In this case, degrees of congestion in the vertical and horizontal directions before a clock wiring is laid are evaluated as well and a distance in the direction is weighted in which wirings are more congested to classify the blocks into groups taking into account the distance which is weighted. The classification into groups itself is carried out by an existing method (software).

Figure 10:
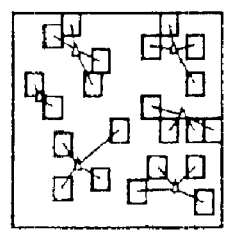
FIG. 10 illustrates a result of classifying a multiplicity of blocks dispersedly arranged on an LSI into groups while keeping vertical and horizontal weight identical.

FIG. 10 illustrates a result of classifying a multiplicity of blocks dispersedly arranged on the LSI 10 of FIG. 9 into groups while keeping vertical and horizontal weight identical (adding weight of 1.0 both vertically and horizontally, that is, without adding weight in this context). In FIG. 10, a line connecting blocks represents a clock wiring and plural blocks connected in parallel by the clock wiring constitutes one group.

In FIG. 10, plural blocks in one group are dispersed equally in the vertical and horizontal directions as a whole, and the clock wirings extend equally in the vertical and horizontal directions as a whole.

Figure 11:
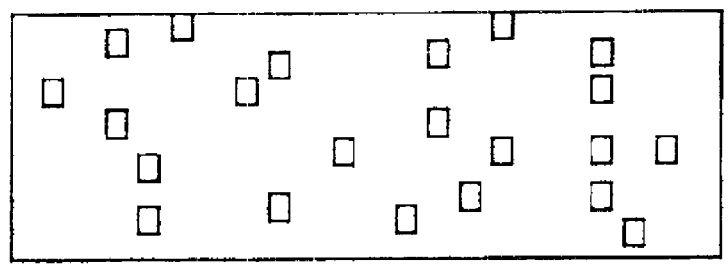
FIG. 11 illustrates the state in which a distance in the horizontal direction is weighted.

FIG. 11 shows a state in which a distance in the horizontal direction is weighted taking into account the fact that wirings are congested in the horizontal direction as in FIG. 3.

Here, weight of 3.0 is added to a distance in the horizontal direction. Consequently, in FIG. 11, the LSI 10 of FIG. 9 is extended to be three times as large in the horizontal direction and an interval between the blocks 20 is also expanded to be three times as large in the horizontal direction.

Figure 12:
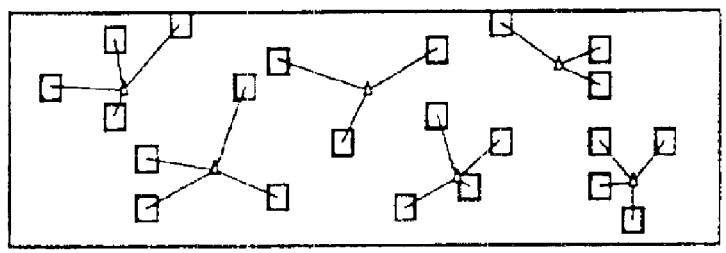
FIG. 12 illustrates a result of classifying blocks into groups while keeping weighting of a distance in the horizontal direction.

FIG. 12 shows a result of classifying blocks into groups while keeping weight added in the horizontal direction.

On FIG. 12, plural blocks in one group are equally separated in the vertical and horizontal directions as a whole, and clock wirings extend equally in the vertical and horizontal directions as a whole.

Figure 13:
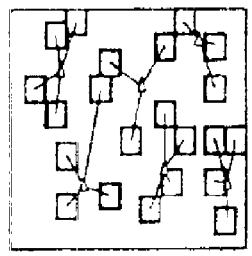

FIG. 13 illustrates a state in which FIG. 12 is reduced by an amount of weight in the horizontal direction and the LSI is returned to the size identical with those in FIGS. 9 and 10.

On FIG. 13, blocks are more widely dispersed in the vertical direction compared with the horizontal direction as a whole, blocks in a more adjacent position each other in the horizontal direction compared with the vertical direction forms one group, and clock wirings extend in the vertical direction as a whole.

Here, as a result of adding weight to a distance in the horizontal direction to classify the blocks into groups because wirings other than the clock wirings are congested in the horizontal direction, one group becomes a set of blocks dispersed in the vertical direction as a whole and the clock wirings extend in the vertical direction, whereby wiring efficiency of the clock wirings is improved.

Next, classification of blocks into groups in the case in which wirings extending in the vertical direction is more congested than wirings extending in the horizontal direction will be described.

Figure 14:
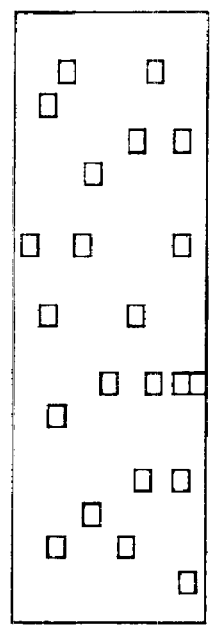
FIG. 14 illustrates the state in which a distance in the horizontal direction is weighted.

FIG. 14 illustrates a state in which a distance in the vertical direction is weighted taking into account the fact that wirings in the vertical direction are congested as in FIG. 6.

Here, weight of 3.0 is added to a distance in the vertical direction. Consequently, in FIG. 14, the LSI 10 of FIG. 9 is extended to be three times as large in the vertical direction and an interval between the blocks 20 is expanded to be three times as large in the vertical direction as well.

Figure 15:
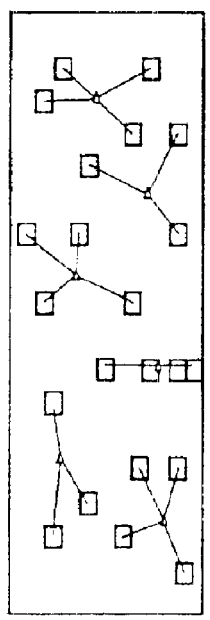
FIG. 15 illustrates a result of classifying blocks into groups while keeping weighting of a direction in the vertical direction.

FIG. 15 illustrates a result of classifying blocks into groups while keeping weighting of a direction in the vertical direction as shown in FIG. 14.

On FIG. 15, plural blocks in one group are widely dispersed equally in the vertical and horizontal directions as a whole, and clock wirings extend equally in the vertical and horizontal directions as a whole.

Figure 16:
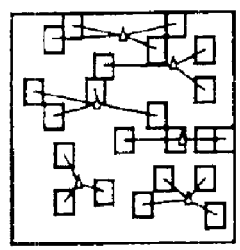

FIG. 16 illustrates the state in which FIG. 15 is reduced in the vertical direction by an amount of weight and the LSI is returned to the original size.

On FIG. 16, blocks constituting one group are more widely dispersed in the horizontal directions as compared with the vertical direction as a whole, blocks in positions more adjacent to each other in the vertical direction compared with the horizontal direction constitute one group, and clock wirings extend in the horizontal direction as a whole.

Here, as a result of weighting a distance in the vertical direction to classify the blocks into groups because wirings before the clock wiring was found congested in the vertical direction, one group becomes a set of blocks dispersed in the horizontal direction as a whole, the clock wirings extend in the horizontal direction and occurrence of large bypass or the like in the clock wirings is avoided, whereby wiring efficiency of the clock wirings is improved.

Next, an example of dividing one LSI into plural areas will be described.

Figure 17:
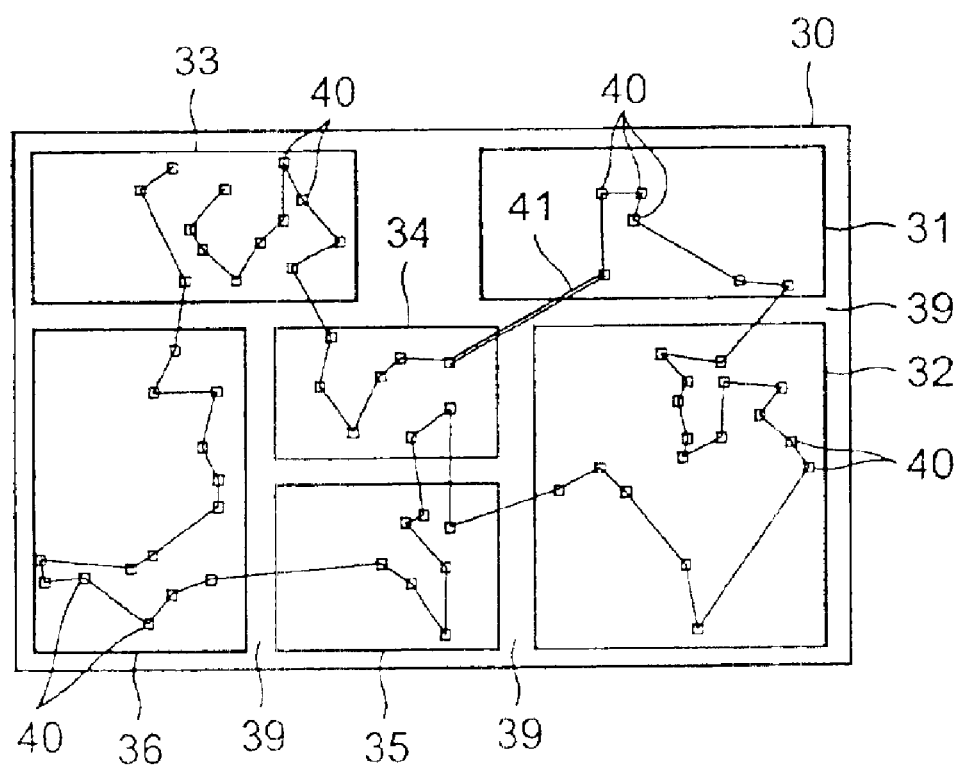
FIG. 17 illustrates the state in which an LSI on which plural blocks are dispersedly arranged is divided into plural areas and the blocks dispersedly arranged on this LSI are wired in series across these plural areas.

FIG. 17 illustrates a state in which an LSI 30 on which plural blocks 40 are dispersedly arranged is divided into plural areas (six areas 31 to 36 in this context) and the blocks 40 dispersedly arranged on this LSI 30 are wired in series across these plural areas 31 to 36.

Here, a part or all of the areas may be designated by an operation of a mouse 104 (see FIG. 24) by an operator or may be automatically divided based on a degree of congestion in each of the vertical and horizontal directions of wiring in each part of the LSI 30.

Here, it is assumed an operator determines that a wiring 41 connecting an area 31 and an area 34 is a wiring that disadvantageously exists in this part. As a reason for determining that the wiring 41 is disadvantageous, for example, wirings (not shown) in that part other than the wiring 41 are very congested and it is highly likely that realizing the wiring 41 on an actual LSI would result in forming the wiring 41 largely bypassed.

In this case, an operator operates a mouse to pick, drag and drop the wiring 41 on a display screen on which FIG. 17 is shown.

Figure 18:
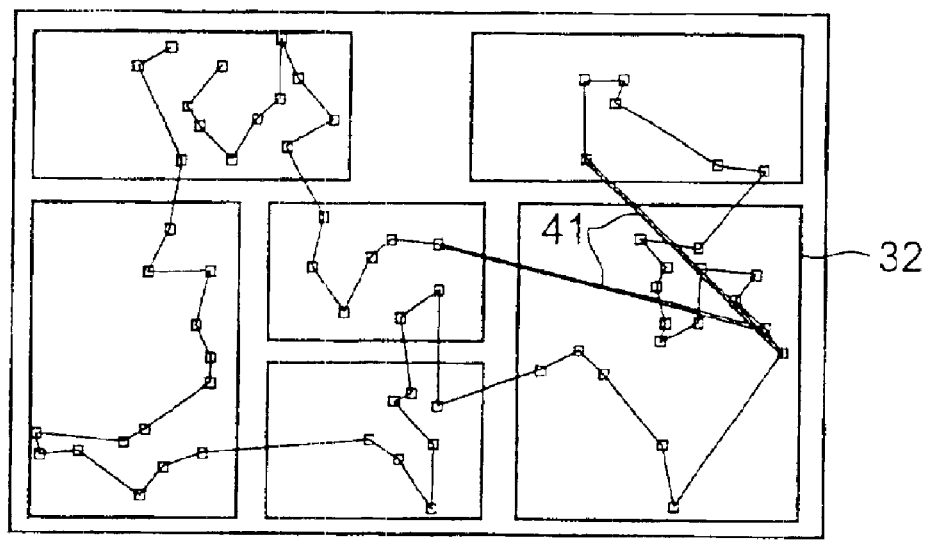
FIG. 18 illustrates an example of a screen when an operation is applied to wirings.

FIG. 18 illustrates an example of a screen when the above operation is performed. In this context, the wiring 41 is dragged to an area 32 and dropped there.

When such an operation is performed, wirings of bocks existing in the vicinity of the point where the wiring 41 is dropped are replaced and a tool for optimizing wirings operates to rewire the blocks.

Figure 19:
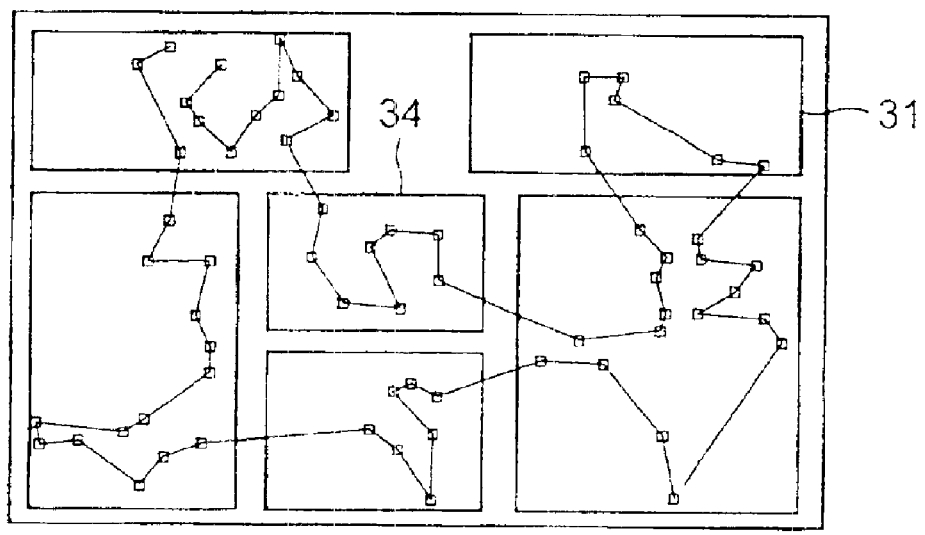
FIG. 19 illustrates wirings after rewiring.

FIG. 19 illustrates wirings after the rewiring.

In FIG. 19, the wiring directly connecting the block 31 and the block 34, which was a problem at the stage of FIG. 17, has disappeared.

Next, it is assumed that the operator instructs rewiring inside a specific area.

Figure 20:
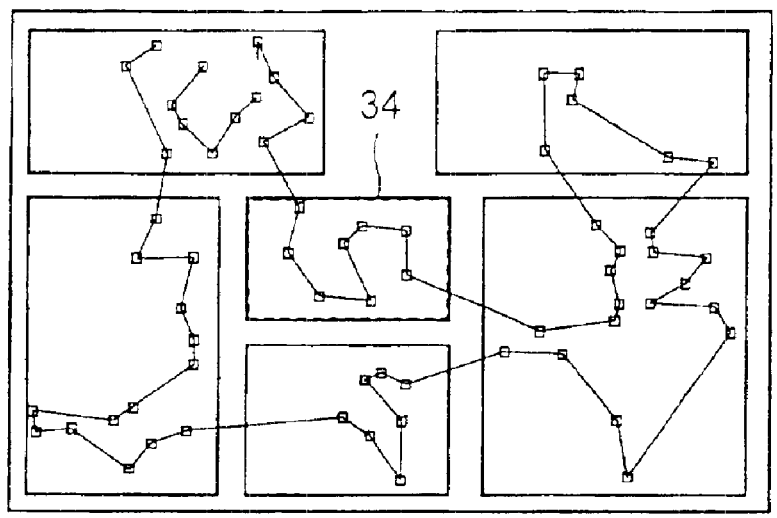
FIG. 20 illustrates the state in which rewiring is instructed.

FIG. 20 illustrates a state in which the operator instructed rewiring of the area 34.

Here, the rewiring of the area 34 is instructed because wirings in the vertical direction of the area 34 are congested and it is desired to give a wiring route extending in the vertical direction as much as possible to a wiring for a scan path in this context.

Here, it is assumed that a distance can be weighted independently for each area and independently for each of the vertical direction and the horizontal direction, and the area 34 is designated and weight of, for example, in the order of 3.0 is added to it in the vertical direction in this context. A method of weighting to wire an area is as described above, and the method is applied not to the entire LSI but one area on the LSI.

Figure 21:
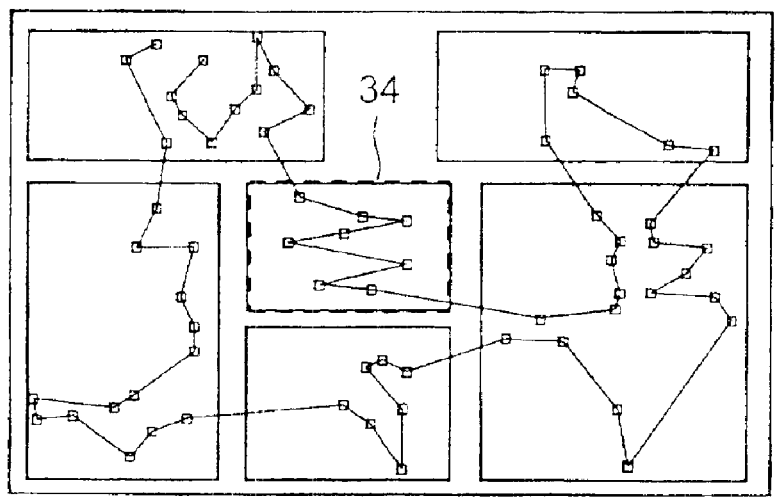
FIG. 21 illustrates a wiring route after rewiring.

FIG. 21 illustrates a wiring route after rewiring the area 34.

As a result of adding weight in the vertical direction to rewire the area 34, wirings for a scan path inside the area 34 are extended in the horizontal direction as a whole and occurrence of a large bypass or the like in the wirings for a scan path is avoided, whereby efficient wiring is carried out.

Figure 22:
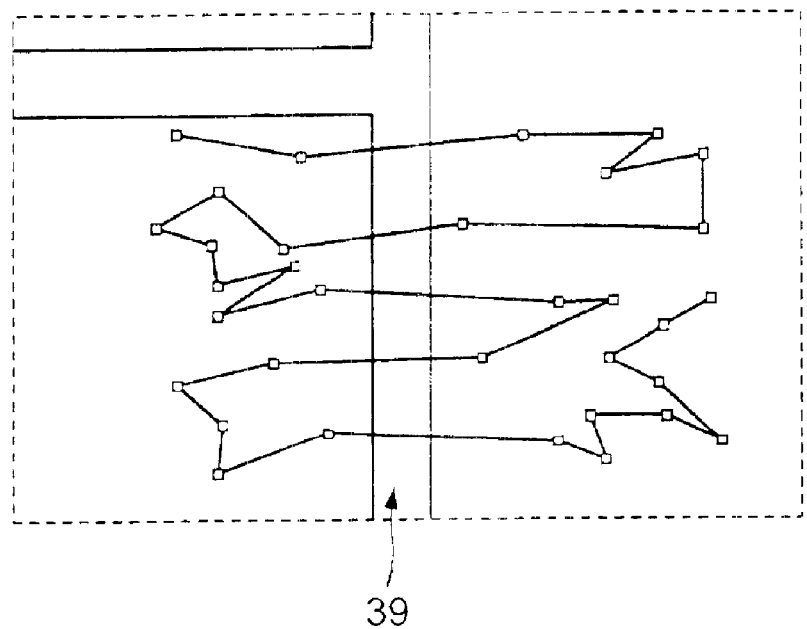
FIG. 22 illustrates wirings before improvement for a scan path across two areas.
Figure 23:
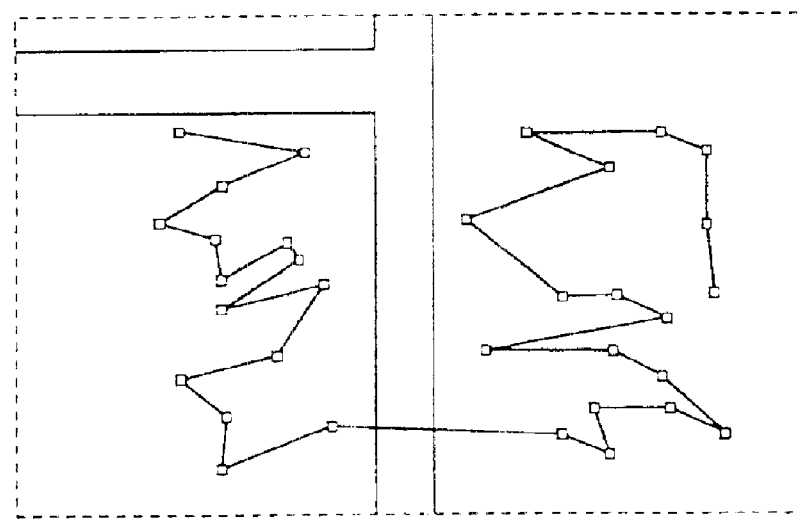
FIG. 23 illustrates wirings after improvement of the san path across two areas.

FIGS. 22 and 23 illustrate wirings before and after improvement for a scan path across two areas.

When an LSI is simply divided into plural areas to weight (or not weight) each area, as a result of laying wirings for a scan path using a predetermined tool, it is likely that a wiring route that goes back and forth between two areas many times is generated.

Thus, in this context, a distance in the width direction of a strip-like region 39 existing between two areas is weighted to lay wirings of a scan path on the area. Consequently, the two areas are separate from each other largely for the purpose of calculating a wiring route, and a wiring route going back and forth between the two areas many times is prevented from being generated. As a result, as shown in FIG. 23, a wiring route in which fewer number of wirings only run between the two areas is generated. Alternatively, wiring may shift to the next block after wiring of all the blocks in one area is completed. This is equivalent to adding an extremely large weight to a distance in the width direction of the strip-like region 39.

Although the wiring for a scan path in an area and across plural areas in the case in which an LSI is divided into plural areas is described here, as is evident from the above description of the classification, classification of blocks into groups and clock wiring can be realized by the same method. That is, when an LSI is divided into plural areas, the same method as that in the above-described wiring for a scan path is applied, whereby the classification and the clock wiring according to a degree of congestion of vertical and horizontal wirings are carried out for each area and plural blocks across plural areas can be prevented from being classified into one group.

Next, embodiments of the wiring route determining apparatus and the group determining apparatus as well as the wiring route determining program and the group determining program of the present invention for realizing the above-described scan path wiring and classification of blocks into groups (clock wiring) will be described.

Figure 24:
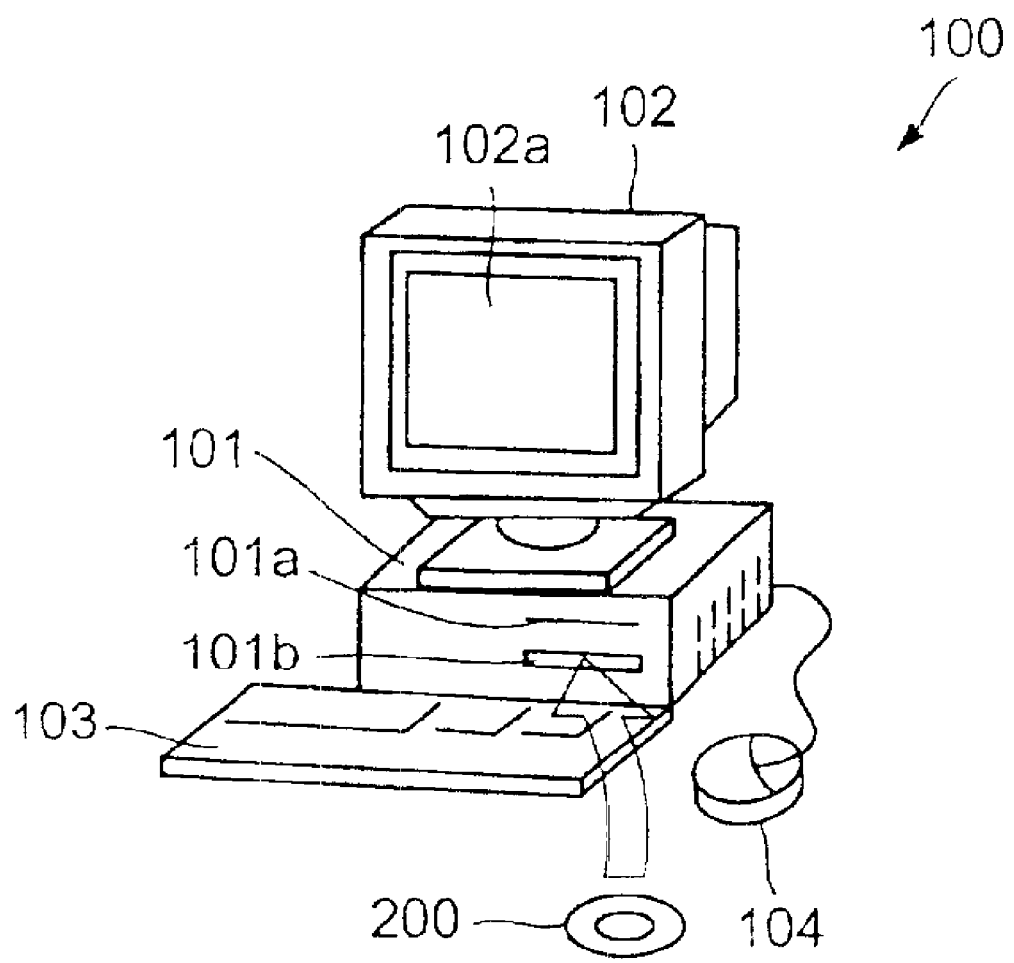
FIG. 24 is an external perspective view of a personal computer constituting each embodiment of the wiring route determining apparatus and the group determining apparatus of the present invention.
Figure 25:
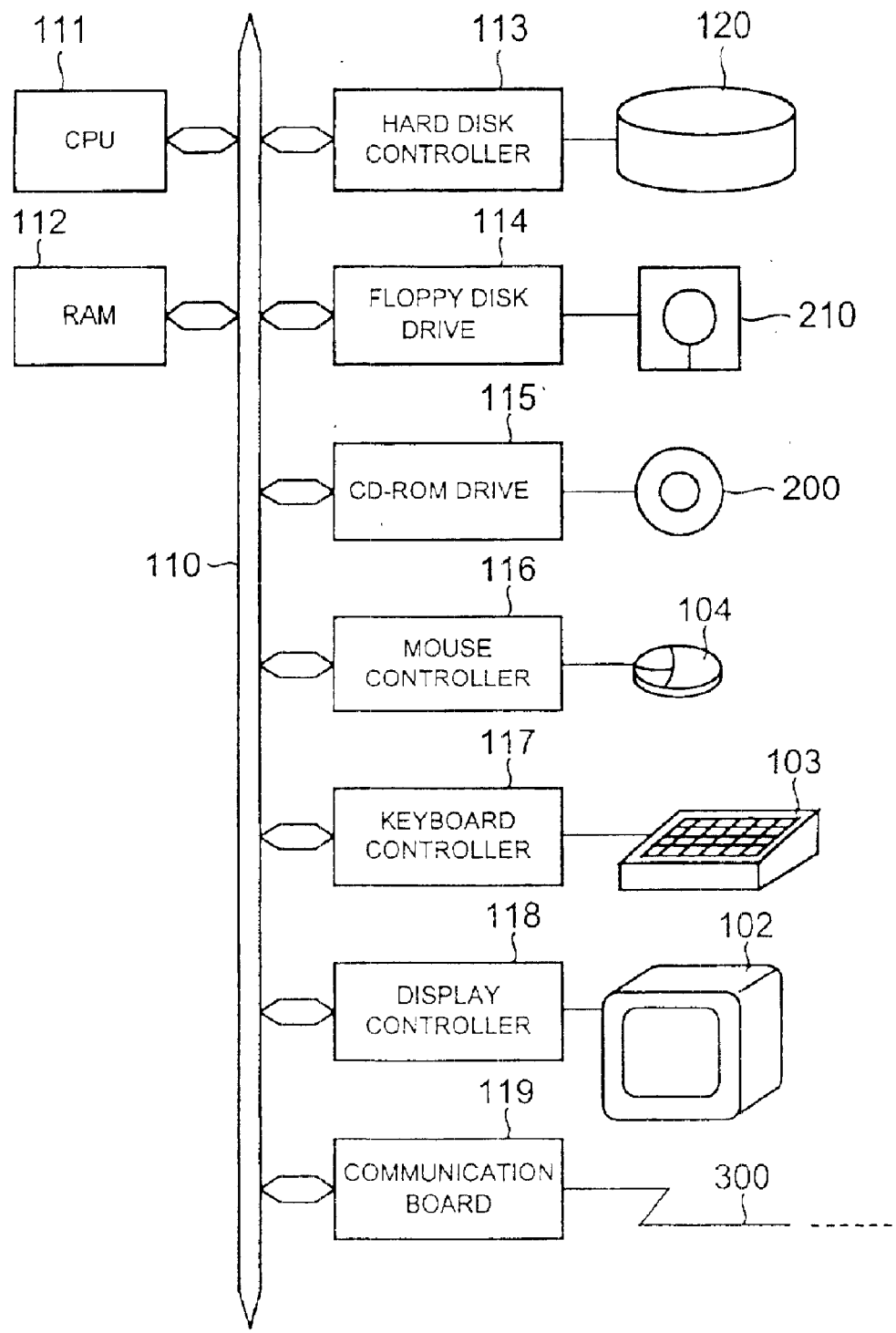
FIG. 25 is a hardware configuration diagram of a personal computer.

FIG. 24 is an external perspective view of a personal computer configuring embodiments of both of the wiring route determining apparatus and the group determining apparatus of the present invention, and FIG. 25 is a hardware configuration diagram of the personal computer whose external appearance is shown in FIG. 24.

Here, a wiring route determining program as an embodiment of the present invention and a group determining program as an embodiment of the present invention are executed in this personal computer, whereby this personal computer operates as each embodiment of the wiring route determining apparatus and the group determining apparatus.

A personal computer 100 is provided with a main body unit 101 incorporating a CPU (Central Processing Unit), a RAM (Random Access Memory), a hard disk, a communication board and the like, a display 102 for displaying images and character strings on a display screen 102a according to an instruction from the main body unit 101, a keyboard for inputting an instruction of a user in the personal computer 100 and the mouse 104 for designating an arbitrary position on the display screen 102a, thereby inputting an instruction corresponding to an icon or the like displayed in the position when it is designated.

As shown in FIG. 24, the main body unit 101 includes an FD inserting port 101a in which a flexible disk (FD) (not shown in FIG. 24) and a CD-ROM inserting port 101b in which a CD-ROM 200 is inserted. In these inserting ports 101a and 101b, an FD drive and a CD-ROM drive for respectively driving the flexible disk and the CD-ROM 200 inserted from the inserting ports to access them are incorporated.

FIG. 25 is a hardware configuration diagram of the personal computer having the appearance shown in FIG. 24.

In this hardware configuration diagram, a CPU 111, a RAM 112, a hard disk controller 113, an FD drive 114, a CD-ROM drive 115, a mouse controller 116, a keyboard controller 117, a display controller 118 and a communication board 119 are shown, which are mutually connected by a bus 110.

As described with reference to FIG. 1, the FD drive 114 and the CD-ROM drive 115 access a flexible disk 210 and the CD-ROM 200 inserted from the FD inserting port 101a and the CD-ROM inserting port 101b, respectively. The communication board 119 is connected to a public communication line 300.

In addition, also shown in FIG. 25 are a hard disk 120 to be accessed by the hard disk controller 113, the mouse 104 to be controlled by the mouse controller 116, a keyboard 103 to be controlled by the keyboard controller 117 and a CRT display 102 to be controlled by the display controller 118.

The CD-ROM 200 having stored therein a wiring route determining program and a group determining program as embodiments of the present invention is inserted in the CD-ROM 101b of the above-described personal computer 100 to install the wiring route determining program and the group determining program stored in the CD-ROM 200 in the personal computer 100, whereby an wiring route determining apparatus and a group determining apparatus as embodiments of the present invention are established and operated in this personal computer.

Figure 26:
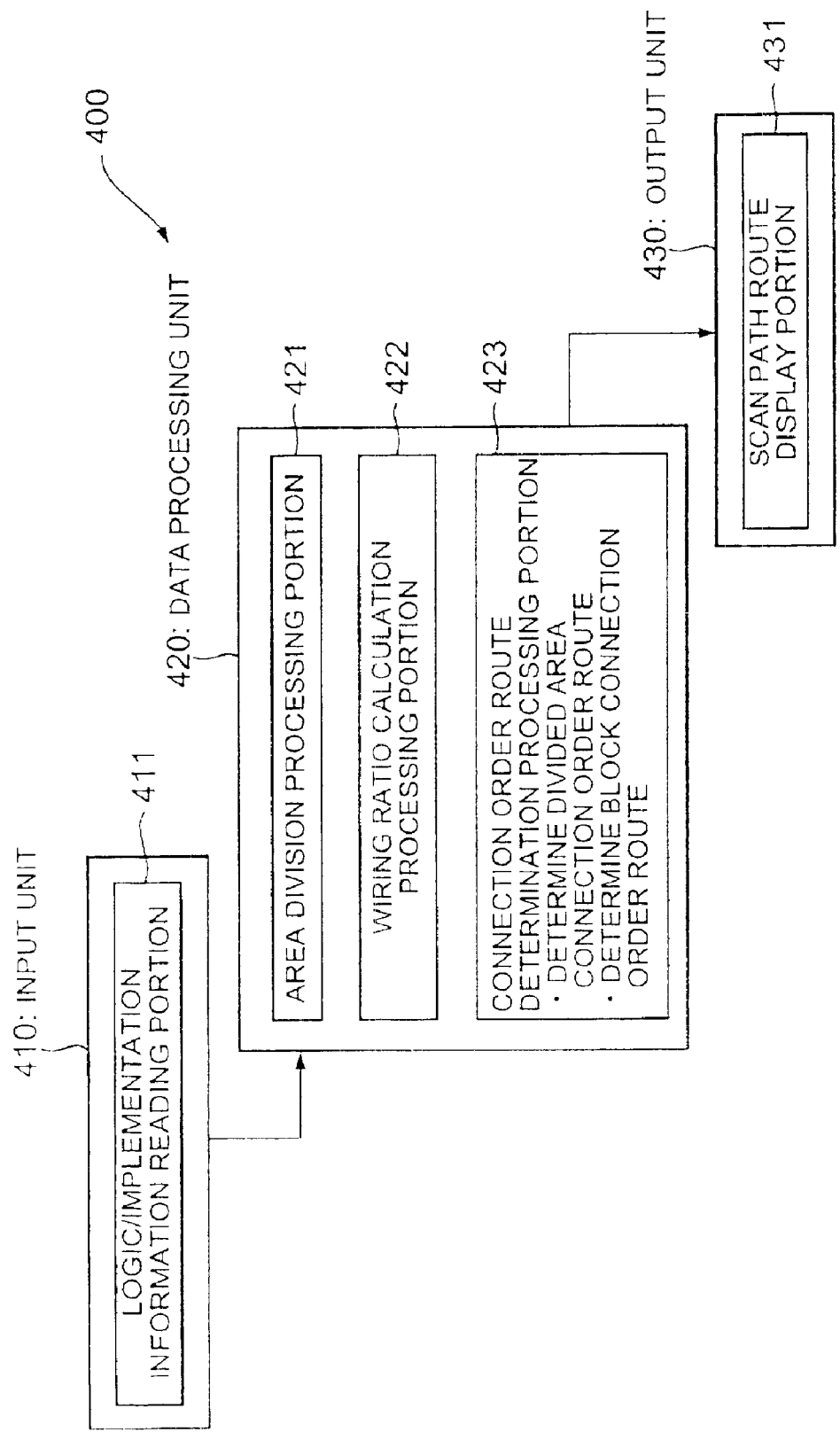
FIG. 26 is a functional block diagram of a wiring route determining apparatus as an embodiment of the present invention.

FIG. 26 is a functional block diagram of a wiring route determining apparatus as an embodiment of the present invention.

A wiring route determining apparatus 400 shown in FIG. 26 is configured by composing the personal computer 100 shown in FIGS. 24 and 25, an OS (Operation System) operating in the personal computer 100 and a wiring route determining program functioning as an application program.

The wiring route determining apparatus 400 has an input unit 410, a data processing unit 420 and an output unit 430. The input unit 410 includes a logic/implementation information reading portion 411, the data processing unit 420 includes an area division processing portion 421, a wiring ratio calculation processing portion 422 and a connection order route determination processing portion 423, and the output unit 430 includes a scan path route display portion 431.

The logic/implementation information reading portion 411 is in charge of reading logic/implementation information constituting an LSI on data, for example, positions where blocks are arranged on an LSI, vertical and horizontal wiring information and the like. The reading of logic/implementation information may be carried out with the intervention of a flexible disk, a CD-ROM and the like or may be carried out via a communication line. Alternatively, when logic/implementation information of an LSI of the personal computer shown in FIGS. 24 and 25 is prepared by the personal computer, the logic/implementation information may be read in the wiring route determining apparatus 400 that is realized in the same personal computer.

In the area division processing portion 421 of the data processing unit 420, as described with reference to FIG. 17, processing for dividing the inside of an LSI into plural areas (areas 31 to 36 in the example of FIG. 17) is carried out according to an operation of an operator, or automatically carried out referring to degrees of congestion of vertical and horizontal wirings in each unit on the LSI that are found in the wiring ratio calculation processing portion 422 to be described below.

The area division processing portion 421 is equivalent to an example of an area dividing portion described in the present invention.

In addition, in the wiring ratio calculation processing portion 422 of the data processing unit 420, a ratio of vertical and horizontal degrees of congestion in each unit or the entire area on the LSI is obtained, and vertical and horizontal distances of the LSI is weighted based on the obtained ratio. The wiring ratio calculation processing portion 422 is equivalent to an example of a weighting portion described in the present invention. Here, weight can be automatically added based on a ratio of degrees of congestion of wirings and the weighting can be changed according to an operation of an operator.

Moreover, in the connection order route determination processing portion 423, a connection routing (wiring route) of blocks is determined. In determining this connection routing (wiring route), as described with reference to FIGS. 1 to 8, a connection routing (wiring route) is determined in a state in which a distance is weighted.

In this context, when an LSI is divided into plural areas, a connection routing between the divided areas and a connection routing between blocks in each area are determined. A wiring route is determined by, for example, the processing described with reference to FIGS. 17 to 23.

The connection order route determination processing portion 423 is equivalent to an example of a wiring route determining portion described in the present invention.

In the scan path route display portion 431 of the output unit 430 of FIG. 26, arrangements and wiring drawings of an LSI as shown in FIGS. 1 to 23 and scan path routes (wiring routes) as shown in FIGS. 2, 5 and 8 and FIGS. 17 to 23 are displayed on the display screen 102a of the personal computer 100 shown in FIG. 24.

Figure 27:
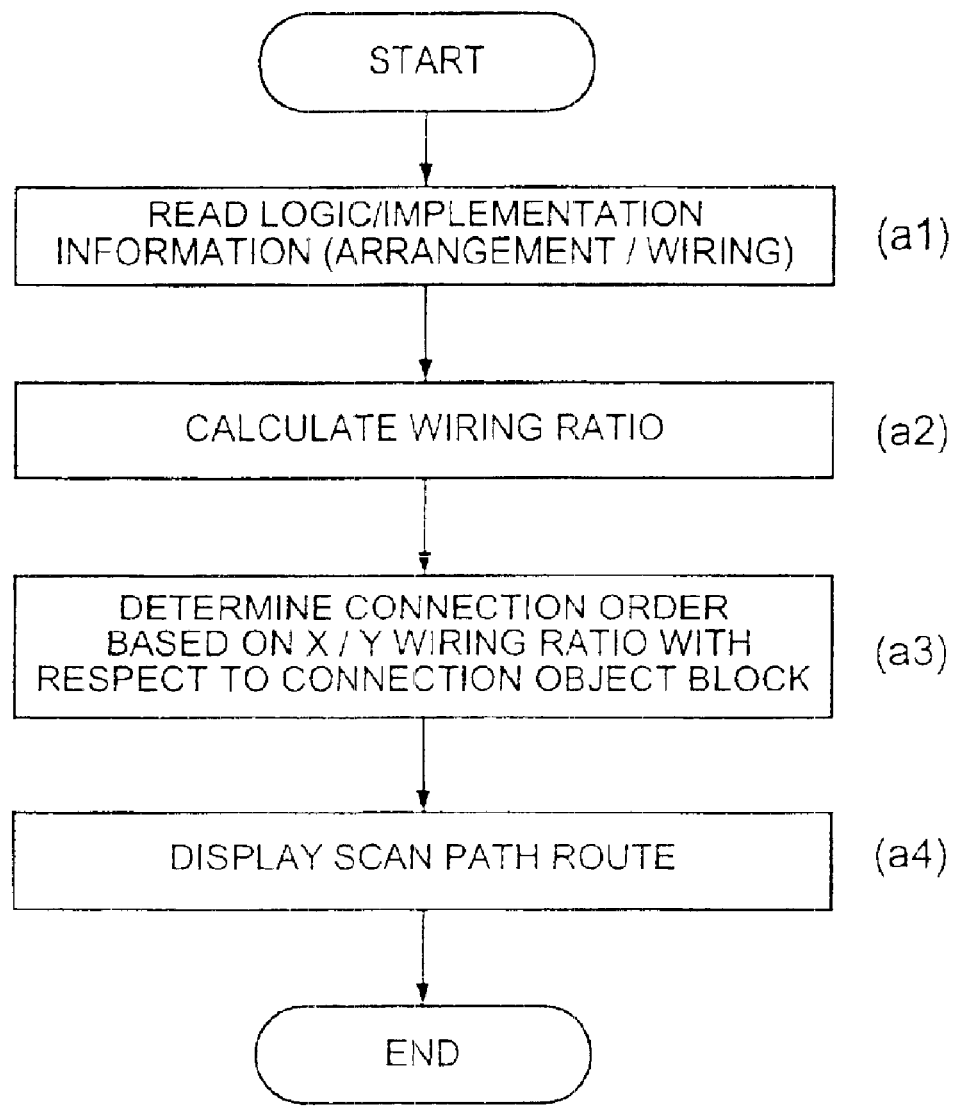
FIG. 27 is a flow chart showing a basic first embodiment of a wiring route determining program of the present invention.

FIG. 27 is a flow chart showing a basic first embodiment of a wiring route determining program of the present invention.

In this context, logic/implementation information is read (step a1), a ratio of degrees of congestion of vertical and horizontal wirings is calculated and a distance in the vertical direction or the horizontal direction is weighted according the ratio (step a2), a connection routing (wiring route) based on a ratio of degrees of congestion of vertical and horizontal wirings (X/Y wiring ratio) is determined with respect to blocks that are objects of connection for a scan path (step a3; see FIGS. 1 to 8), and the determined scan path route is displayed (step a4).

Figure 28:
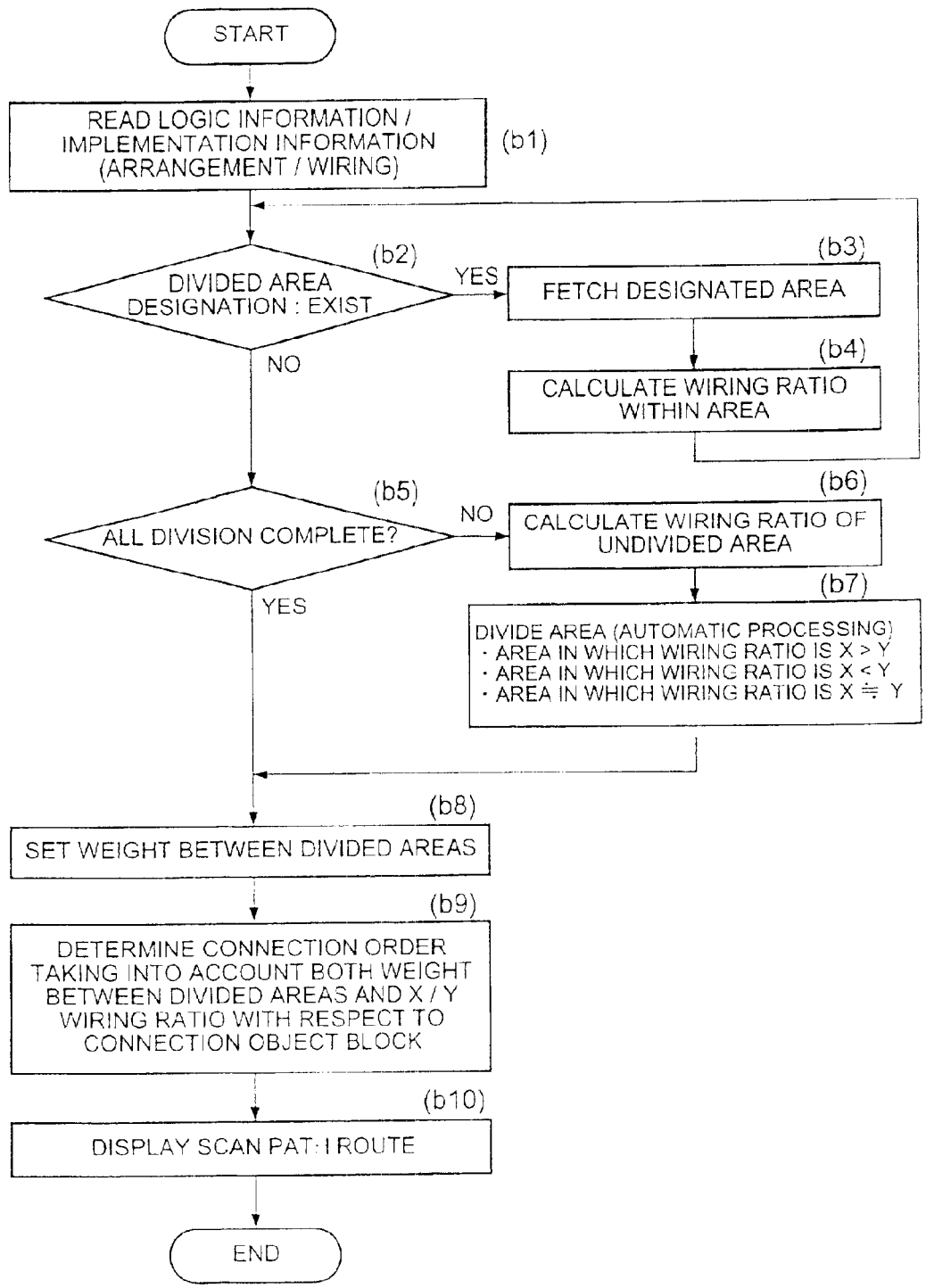
FIG. 28 is a flow chart showing a second embodiment of the wiring route determining program of the present invention.

FIG. 28 is a flow chart showing a second embodiment of the wiring route determining program of the present invention.

In this context, after logic/implementation information is read (step b1), it is determined whether or not a designation of a divided area exists (step b2). An arbitrary part of region on an LSI can be designated as one area by an operation of the mouse 104 shown in FIG. 24. In step 2b, it is determined whether or not such an area designated by an operator exists.

When such an area designated by an operator exists, the processing advances to step b3, where positional information of the designated area is fetched, and a wiring ratio (ratio of vertical and horizontal degrees of congestion of a wiring) inside the area is calculated in step b4. The steps b3 and b4 are repeated for the number of times equivalent to the number of areas designated by the operator (step b2).

In step b2, if it is determined that a divided area does not exist, the processing advances to step b5. The case in which a divided area does not exist means both the case in which a divided area is not designated by an operator in the first place and the case in which the processing of steps b3 and b4 are finished for all the designated areas.

In step b5, it is determined whether or not area division has been completed for all the regions of the LSI. Divided areas are not always designated by the operator for all the regions of the LSI and a divided area may not be designated by the operator or may be designated for only a part of regions of the LSI. Instep b5, it is determined whether area division has been completed for all the regions of the LSI.

When there is a region where area division has not been completed yet, the processing advances to step b6, where calculation of a wiring ratio is carried out for each portion inside the undivided areas and, in step b7, the LSI is divided according to a wiring ratio of X (a degree of congestion of wirings in the horizontal direction) and Y (a degree of congestion of wirings in the vertical direction) into areas of X>Y, X<Y and X≦Y.

Next, weight between divided areas are set in step b8. In this context, weight of the strip-like region 39 provided between areas described with reference to FIG. 22 is set.

Next, in step b9, a connection order of scan paths is determined taking into account both weight between divided areas (the strip-like region 39 of FIG. 22) and an X/Y wiring ratio with respect to blocks for connection for a scan path, and in step b10, the determined scan path route is displayed.

Figure 29:
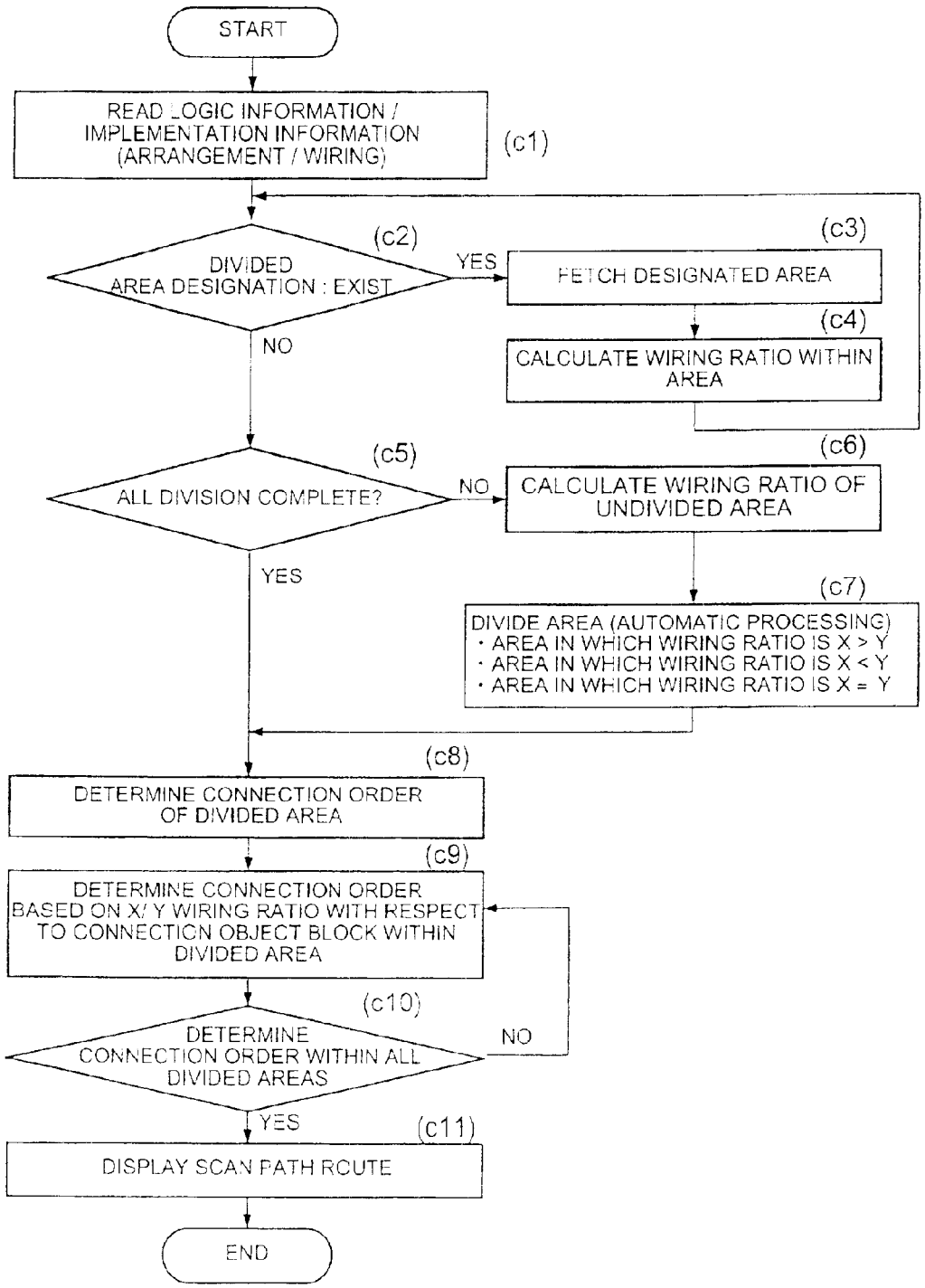
FIG. 29 is a flow chart showing a third embodiment of the wiring route determining program of the present invention.

FIG. 29 is a flow chart showing a third embodiment of the wiring route determining program of the present invention.

Since steps c1 to c7 of FIG. 29 is identical with each of steps b1 to b7 of FIG. 28, description is omitted.

In step c8 of FIG. 29, a connection order between divided areas is determined and, in step c9, a connection order is determined based on an X/Y wiring ratio with respect to blocks that are objects of connection in one divided area. This processing is repeated for all the divided areas (step c10). When the order of a connection between divided areas is determined in step c8 and a connection order is determined in all the divided areas, a scan path route determined by the processing is displayed (step c11).

In the case of the wiring route determining program shown in FIG. 28, weight is set between divided areas in step b8 and, in step b9, connection orders are collectively determined for all the regions in the LSI taking into account an X/Y wiring ratio (vertical and horizontal weight) inside the divided areas and weight between the divided areas. Thus, if the weight between the divided areas in step b8 is small, it is likely that there would be plural scan path wirings connecting plural divided areas as shown in, for example, FIG. 22. However, in FIG. 29, since a connection order among divided areas is determined in step c8 and a connection order is determined for each divided area in step c9, a scan path wiring connecting two divided areas is always fixed as one as shown in FIG. 23, and blocks to be wired inside one divided area are all connected by scan path wirings that do not extend from the divided area and then a scan path wiring becomes a wiring route toward the next divided area.

Figure 30:
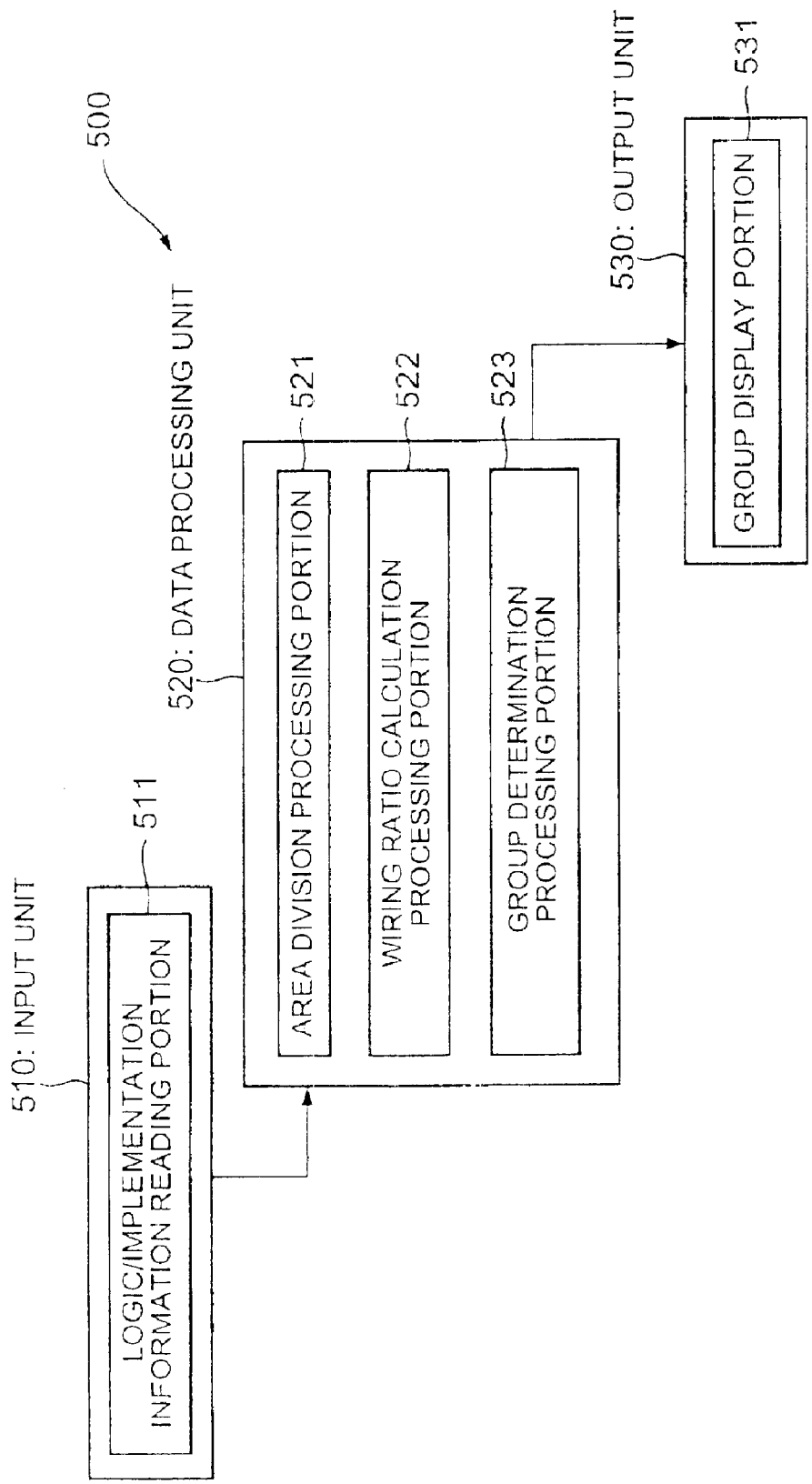
FIG. 30 is a functional block diagram showing an embodiment of a group determining apparatus of the present invention.

FIG. 30 is a functional block diagram showing an embodiment of a group determining apparatus of the present invention.

A group determining apparatus 500 shown in FIG. 30 is configured by composing the personal computer 100 shown in FIGS. 24 and 25, an OS (Operation System) operating in the personal computer 100 and a group determining program functioning as an application program.

The group determining apparatus 500 has an input unit 510, a data processing unit 520 and an output unit 530. The input unit 510 includes a logic/implementation information reading portion 511, the data processing unit 520 includes an area division processing portion 521, a wiring ratio calculation processing portion 522 and a group determination processing portion 523, and the output unit 530 includes a group display portion 531.

Since the logic/implementation information reading portion 511, the area division processing portion 521 and the wiring ratio calculation processing portion 522 of the group determining apparatus 500 are identical with the logic/implementation information reading portion 411, the area division processing portion 421 and the wiring ratio calculation processing portion 422 of the wiring route determining apparatus 400 shown in FIG. 26, repeated descriptions are omitted here.

When an LSI is divided into plural areas in the area division processing portion 521, the group determining processing portion 523 of the data processing unit 520 of the group determining apparatus 500 shown in FIG. 30 carries out group determination processing of blocks to be classified into groups taking into account weight of vertical and horizontal distance according to a wiring ratio for each area obtained in the wiring ratio calculation processing portion 522 for each area. In this group determination processing, classification of blocks into groups by the processing procedures described with reference to FIGS. 9 to 16 is carried out for each area.

In the group display portion 531 of the output unit 530 of the group determining apparatus 500 in FIG. 30, a group determined in the group determination processing portion 523 is displayed.

Figure 31:
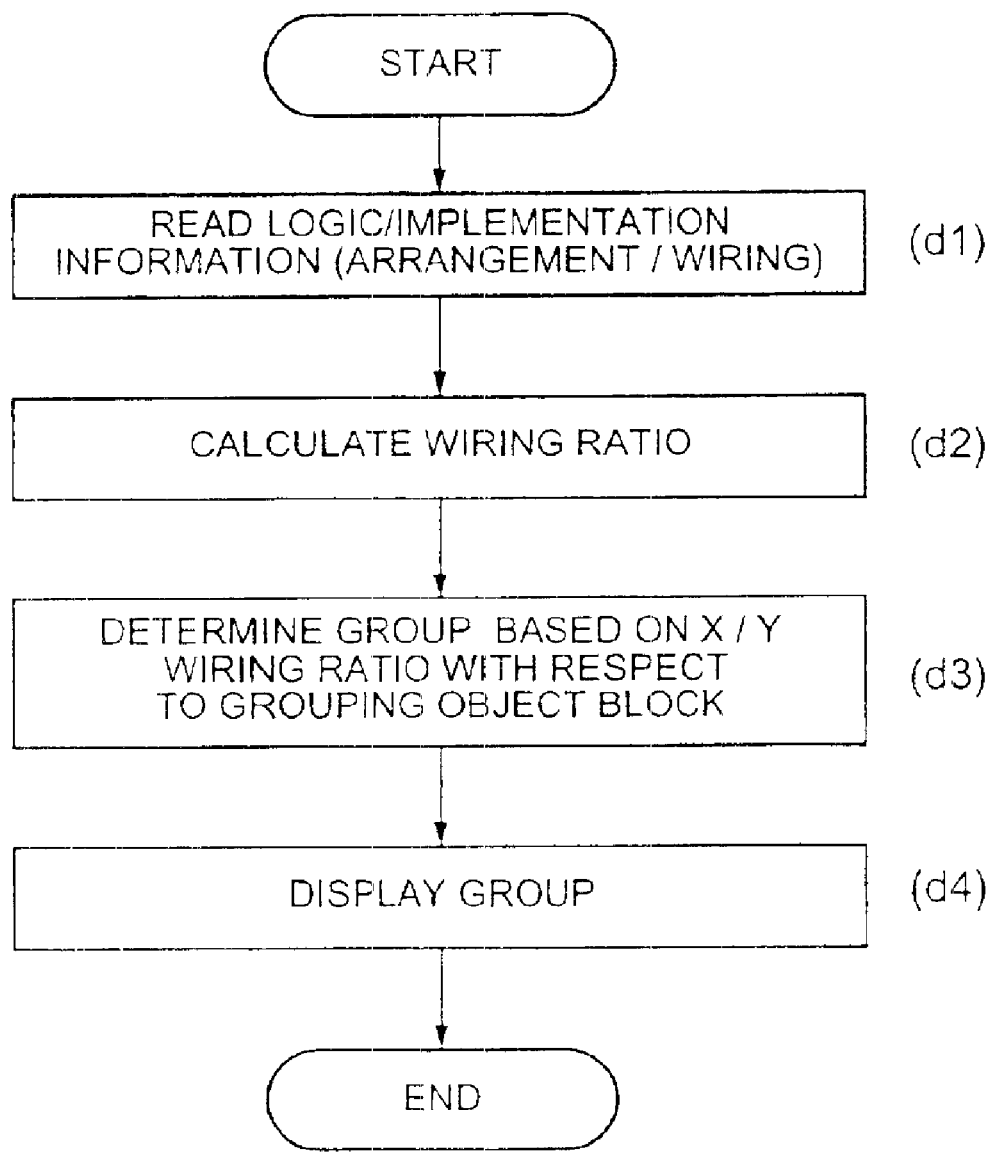
FIG. 31 is a flow chart showing a basic first embodiment of a group determining program of the present invention.

FIG. 31 is a flow chart showing a basic first embodiment of a group determining program of the present invention.

In this context, logic/implementation information is read (step d1), a ratio of degrees of congestion of vertical and horizontal wirings is calculated and a distance in the vertical direction or the horizontal direction is weighted according to the obtained ratio (step d2), a group is determined based on a ratio of degrees of congestion of vertical and horizontal wirings (X/Y wiring ratio) with respect to blocks to be classified into groups (step d3; see FIGS. 9 to 16), and the determined group is displayed (step d4).

Figure 32:
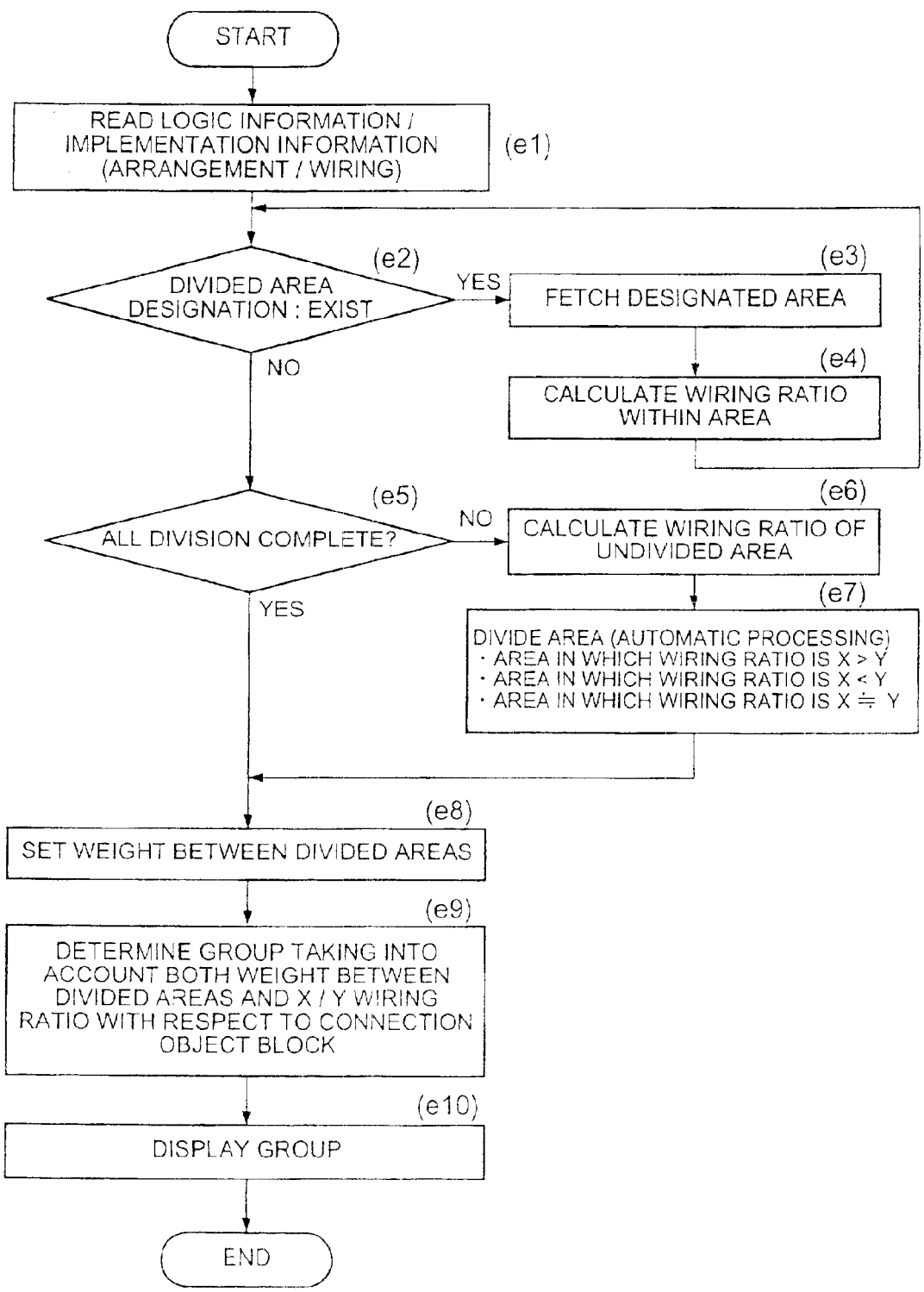
FIG. 32 is a flow chart showing a second embodiment of the group determining program of the present invention.

FIG. 32 is a flow chart showing a second embodiment of the group determining program of the present invention.

Since steps e1 to e8 of FIG. 32 are identical with steps b1 to b8 of the wiring route determining program shown in FIG. 28, respectively, repeated descriptions are omitted here.

In step e9 of FIG. 32, a group of blocks is determined taking into account both weight and an X/Y wiring ratio between divided areas (strip-like region 39 of FIG. 22) with respect to blocks to be classified into groups, and the determined group is displayed in step e10.

Figure 33:
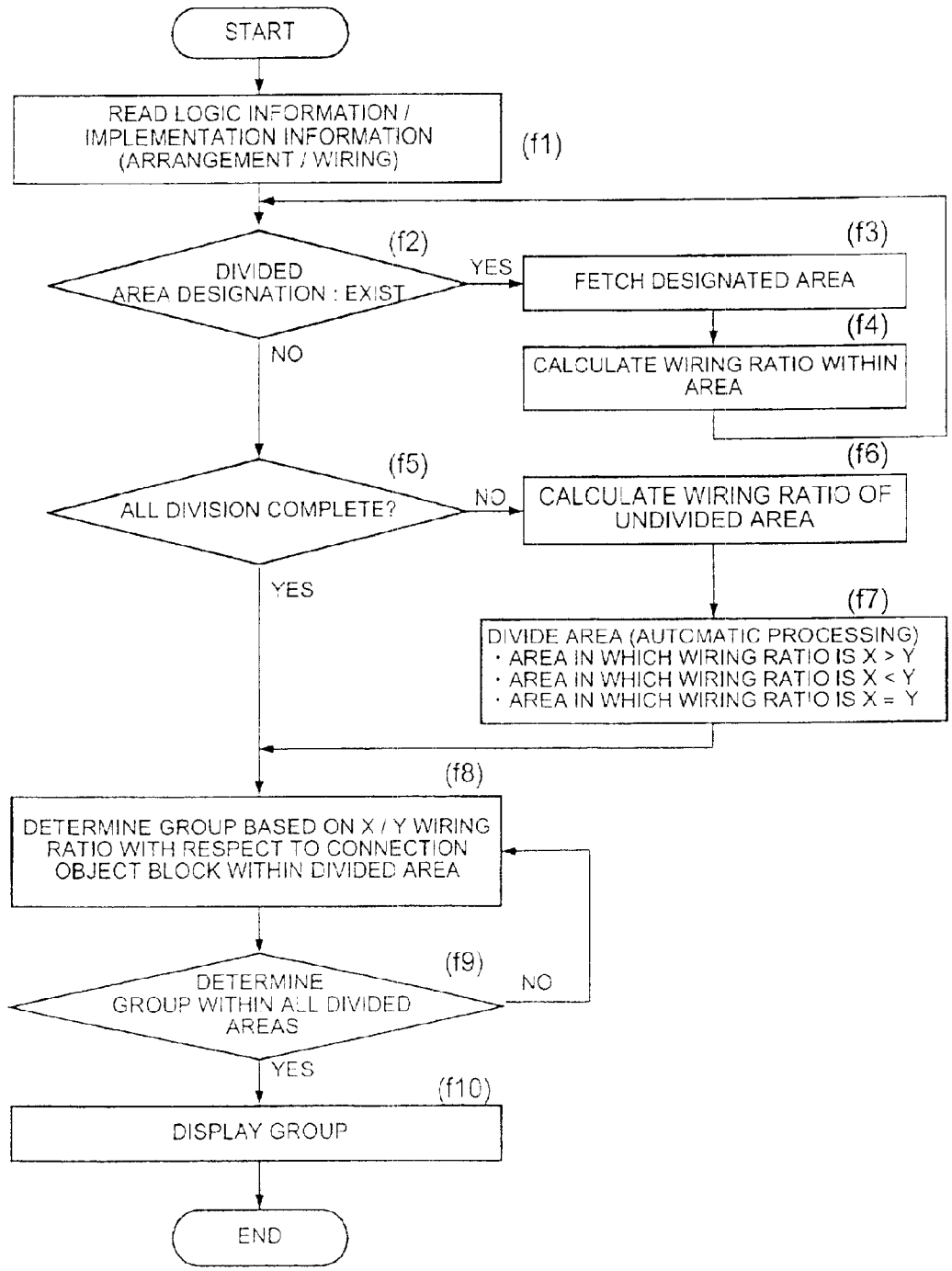
FIG. 33 is a flow chart showing a third embodiment of the group determining program of the present invention.

FIG. 33 is a flow chart showing a third embodiment of the group determining program of the present invention.

Since steps f1 to f7 of FIG. 33 are identical with steps e1 to e7 of FIG. 32, respectively, repeated descriptions are omitted here.

In step f8 of FIG. 33, a group based on an X/Y wiring ratio is determined with respect to blocks to be classified into groups in one divided area, which is repeated for all divided areas (step f9). When groups are determined for all the divided areas, the groups thus determined are displayed (step f10).

In the case of the group determining program shown in FIG. 32, weight is set between divided areas in step e8, and groups are collectively determined for all regions of the LSI taking into account an X/Y wiring ratio (vertical and horizontal weight) inside a divided area and weight between divided areas in step e9. Thus, it is likely that one group extends across plural divided areas if weight between divided areas in step e8 is small. However, since a group is determined for each divided area in step f8 in FIG. 33, a group extending across two divided areas is prevented from being formed.

Further, although the above-described embodiments have been described on the premise that a wiring pattern is a wiring pattern having vertical and horizontal angles (0° and 90°), the present invention is not limited to a wiring pattern having vertical and horizontal angles (0° and 90°) and can be applied to the case of an oblique wiring pattern having angles such as 45° and 135° or the like.

As described above, according to the present invention, a wiring route and a group with high wiring efficiency are determined.

What is claimed is:

1. A wiring route determining apparatus comprising:
    a weighting portion to receive first and second weightings from a user respectively for first and second planar sections of a layout, to independently stretch or shrink the planar sections, the planar sections being stretched or shrunk independently in a first direction or a second direction different from the first direction; and
    a wiring route determining portion to automatically determine a wiring route for the layout based on the weightings.

2. The wiring route determining apparatus of claim 1, wherein each of the first and second planar sections contains a plurality of terminals.

3. The wiring route determining apparatus of claim 2, wherein the wiring route contains a serial connection of the terminals between the first and second planar sections.

4. The wiring route determining apparatus of claim 2, wherein the wiring route contains parallel connections of the terminals of the first and second planar sections such that the wiring route does not connect the first and second planar sections.

5. The wiring route determining apparatus of claim 1, wherein the weightings are proportional to an amount of stretching or shrinking.

6. The wiring route determining apparatus of claim 1, wherein
    the user assigns a third weighting to a space between the first and second planar sections of the layout to stretch or shrink the space between the first and second planar sections in the first or second direction, the third weighting being independent of the first and second weightings, and
    the wiring route determining portion automatically determines the wiring route for the layout based on the first through third weightings.

7. The wiring route determining apparatus of claim 6, wherein
    the user manually changes the routing of a wiring to a new routing, and
    the wiring route for a remainder of the layout is automatically adjusted around the new routing.

8. The wiring route determining apparatus of claim 1, wherein
    the user manually changes the routing of a wiring to a new routing, and
    the wiring route for a remainder of the layout is automatically adjusted around the new routing.

9. A wiring route determining apparatus comprising:

a weighting portion to receive first and second weightings respectively for first and second planar sections of a layout, to independently stretch or shrink the planar sections, the planar sections being stretched or shrunk independently in a first direction or a second direction different from the first direction; and a wiring route determining portion to automatically determine a wiring route for the layout based on the weightings.

10. The wiring route determining apparatus of claim 9, wherein each of the first and second planar sections contains a plurality of terminals.

11. The wiring route determining apparatus of claim 10, wherein the wiring route contains a serial connection of the terminals between the first and second planar sections.

12. The wiring route determining apparatus of claim 10, wherein the wiring route contains parallel connections of the terminals of the first and second planar sections such that the wiring route does not connect the first and second planar sections.

13. The wiring route determining apparatus of claim 9, wherein the weightings are proportional to an amount of stretching or shrinking.

14. The wiring route determining apparatus of claim 9, wherein a third waiting is assigned to a space between the first and second planer sections, a user assigns a third weighting to a space between the first and second planar sections of the layout to stretch or shrink the space between the first and second planar sections in the first or second direction, the third weighting being independent of the first and second weightings, and the wiring route determining portion automatically determines the wiring route for the layout based on the first through third weightings.

* * * * *

UNITED STATES PATENT AND TRADEMARK OFFICE
CERTIFICATE OF CORRECTION

PATENT NO. : 6,907,594 B2
DATED : June 14, 2005
INVENTOR(S) : Aoki

It is certified that error appears in the above-identified patent and that said Letters Patent is hereby corrected as shown below:

Title page,
Item [56], References Cited, OTHER PUBLICATIONS,
"Vutukurvet et al." reference, change "Conferenc" to -- Conference --.

Column 16,
Line 9, change "planer" to -- planar --.

Signed and Sealed this

Twenty-first Day of March, 2006

JON W. DUDAS
*Director of the United States Patent and Trademark Office*